United States Patent [19]

Havemann

[11] Patent Number: 5,728,628
[45] Date of Patent: Mar. 17, 1998

[54] TWO-STEP METAL ETCH PROCESS FOR SELECTIVE GAP FILL OF SUBMICRON INTER-CONNECTS AND STRUCTURE FOR SAME

[75] Inventor: Robert H. Havemann, Garland, Tex.

[73] Assignee: Texas Instruments Incorporated, Dallas, Tex.

[21] Appl. No.: 606,657

[22] Filed: Feb. 26, 1996

Related U.S. Application Data

[63] Continuation of Ser. No. 250,142, May 27, 1994, abandoned.

[51] Int. Cl.⁶ .................................................. H01L 21/44
[52] U.S. Cl. .......................... 438/668; 438/763; 438/780; 438/669
[58] Field of Search ............................ 437/195, 978, 437/211, 50, 186, 187; 438/669, 778, 668, 763, 780

[56] References Cited

U.S. PATENT DOCUMENTS

| | | | |
|---|---|---|---|
| 4,584,079 | 4/1986 | Lee et al. | 204/192 |
| 4,986,878 | 1/1991 | Malazgirt et al. | 156/643 |
| 4,987,101 | 1/1991 | Kaanta et al. | 437/228 |
| 5,004,704 | 4/1991 | Maeda et al. | 437/195 |
| 5,103,288 | 4/1992 | Sakamoto et al. | 357/71 |
| 5,166,101 | 11/1992 | Lee et al. | 437/238 |
| 5,272,117 | 12/1993 | Roth et al. | 437/195 |
| 5,278,103 | 1/1994 | Mallon et al. | 437/240 |
| 5,324,683 | 6/1994 | Fitch et al. | 437/65 |
| 5,356,513 | 10/1994 | Burke et al. | 437/195 |
| 5,441,915 | 8/1995 | Lee | 437/195 |

FOREIGN PATENT DOCUMENTS

| | | |
|---|---|---|
| 0 089 559 A2 | 9/1983 | European Pat. Off. . |
| 0 365 584 A2 | 5/1990 | European Pat. Off. . |
| 0 411 795 A1 | 2/1991 | European Pat. Off. . |
| 0 537 001 A1 | 4/1993 | European Pat. Off. . |
| 3-16223 | 1/1991 | Japan ........................ 437/50 |

*Primary Examiner*—Charles L. Bowers, Jr.
*Assistant Examiner*—Lynne A. Gurley
*Attorney, Agent, or Firm*—Kay Houston; W. James Brady, III; Richard L. Donaldson

[57] ABSTRACT

A semiconductor device and method having a low-permittivity material between closely-spaced leads in order to decrease unwanted capacitance, while having a more structurally strong dielectric between widely-spaced leads where capacitance is not as critical. Metal layer 14 is deposited on a substrate 12 of a semiconductor wafer 10, where the metal layer 14 has a first portion 15 and a second portion 17. Widely-spaced leads 16 are formed in the first portion 15 of the metal layer 14, and a first structural dielectric layer 26 is deposited on at least the widely-spaced leads. Closely-spaced leads 18 are formed in the second portion 17 of the metal layer 14, and low-permittivity material 34 is deposited between closely-spaced leads 18. A second structural dielectric layer 36 is deposited on at least low-permittivity material 34 and closely-spaced leads 18. An advantage of the invention includes improved structural strength by placing structurally weak low-permittivity material only where needed, in areas having closely-spaced leads.

10 Claims, 7 Drawing Sheets

5,728,628

TWO-STEP METAL ETCH PROCESS FOR SELECTIVE GAP FILL OF SUBMICRON INTER-CONNECTS AND STRUCTURE FOR SAME

This application is a continuation of application Ser. No. 08/250,142, filed May 27, 1994 now abandoned.

CROSS-REFERENCE TO RELATED APPLICATIONS

The following co-assigned U.S. patent applications am hereby incorporated herein by reference:

| TI Case | Ser. No. | Filing Date | Inventor | Title |
| --- | --- | --- | --- | --- |
| TI-18509 | 08/137,658 | 10/15/93 | Jeng | Planarized Structure for Line-to-Line Capacitance Reduction |
| TI-18867 | 08/201,679 | 2/25/94 | Jeng et al | Selective Filling Narrow Gaps with Low-dielectric-constant materials |
| TI-18929 | 08/202,057 | 2/25/94 | Jeng | Planarized Multilevel Interconnect Scheme with Embedded Low-Dielectric-Constant Insulators |
| TI-19068 | — | 4/28/94 | Cho | Low Dielectric Constant Insulation in VLSI applications |
| TI-19071 | — | 4/27/94 | Havemann | Via Formation in Polymeric Materials |
| TI-18941 | — | 5/20/94 | Gnade et al | A Low Dielectric Constant Material for Electronics Applications |
| TI-19072 | — | 5/20/94 | Havemann et al | Interconnect Structure with an Integrated Low Density Dielectric |

The following U.S. patent applications filed concurrently herewith the patent application for the present invention are also incorporated herein by reference:

| TI Case | Inventor | Title |
| --- | --- | --- |
| TI-19073 | Tigelaar et al | Suppression of Interlead Leakage when using Airgap dielectric |
| TI-19154 | Tsu | Reliability Enhancement of Aluminum interconnects by Reacting Aluminum Leads with a Strengthening Gas |

FIELD OF THE INVENTION

This invention relates generally to the fabrication of semiconductor devices, and more specifically to the patterning of metallic interconnect layers having submicron spacing and using low-permittivity materials between leads.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections. As geometries shrink and functional density increases, it becomes imperative to reduce the RC time constant within multi-level metallization systems.

SUMMARY OF THE INVENTION

Although the dielectric typically used in the past to isolate metal lines from each other was silicon dioxide, recent trends have been towards using materials with low-dielectric constants in order to reduce the RC time constant. Many low-dielectric insulators are either pure polymers (e.g. parylene, teflon, polyimide) or organic spin-on glass (OSOG, e.g. silsequioxane and siloxane glass). The structural strength of these low-permittivity materials is generally poorer than that of silicon dioxide.

Thus, the use of low-permittivity materials in the semiconductor industry has resulted in a need for a method of increasing the structural support of a semiconductor wafer. A semiconductor device and method is disclosed herein that solves this problem in a novel fashion. Low-permittivity materials are used only in areas having closely-spaced leads, decreasing unwanted capacitance between closely-spaced leads, while traditional dielectric materials are used elsewhere, providing strong structural support.

One embodiment of the present invention encompasses depositing a metal layer on a substrate of a semiconductor wafer, where the metal layer has a first portion and a second portion. Widely-spaced leads are formed in the first portion of the metal layer, where the widely-spaced leads have leads spaced apart by more than one and one-half the minimum lead spacing. A first structural dielectric layer is deposited on the widely-spaced leads. Closely-spaced leads are formed in the second portion of the metal layer, where the closely-spaced leads have leads spaced apart less than or equal to one and one-half the minimum lead spacing. A low-permittivity material is deposited between the closely-spaced leads. The low-permittivity material provides a dielectric constant of less than 3 in a region between the metal leads. A second structural dielectric layer is deposited on the low-permittivity material and the closely-spaced leads.

Another embodiment of the present invention includes depositing a metal layer on a substrate. The metal layer has a first portion and a second portion. An etch-stopping dielectric layer is deposited on the metal layer, and a resist layer is deposited on the etch-stopping dielectric layer. The resist layer is patterned to form a conductor pattern. The resist layer is removed, and the etch-stopping dielectric layer and metal layer are etched to form metal leads, where widely-spaced leads are formed in the first portion of the metal layer. A fast structural dielectric layer is deposited on the widely-spaced leads. A low-permittivity material is deposited between the closely-spaced leads. A second structural dielectric layer is deposited on the low-permittivity material and the closely-spaced leads.

A further embodiment includes a semiconductor device structure comprising a substrate having a first portion and a second portion. Widely-spaced leads are formed on the first portion of the substrate, with a first structural dielectric layer between the widely-spaced leads. Closely-spaced leads are formed on the second portion of the substrate, with a low-permittivity material between the closely-spaced leads. A second structural dielectric layer is located on the low-permittivity material and the closely-spaced leads.

An advantage of the invention includes improved structural strength by placing structurally weak low-permittivity material only where needed, in areas having closely-spaced leads.

A further advantage of the invention includes a reduction in fringing capacitance of closely-spaced metal leads. A first structural dielectric layer or etch-stop dielectric layer resides on the metal leads, which results in an increased height of the low-permittivity material on closely-spaced metal leads. This allows the low-permittivity material to extend beyond the top of the metal leads, providing for an increase in process margin.

Another advantage of the invention is that vias to underlying metal leads may be formed through a structurally sound and high quality dielectric material, so that traditional via formation processes can be utilized.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

Figure 1A:
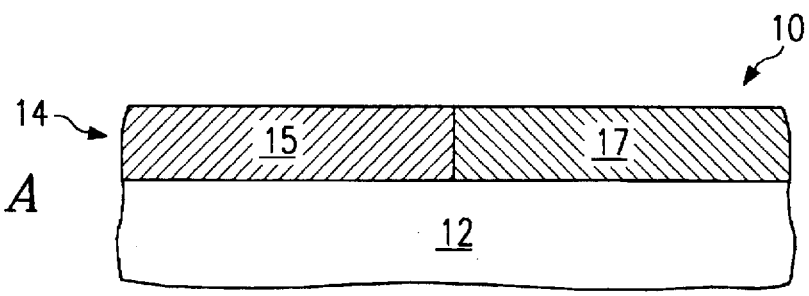
FIGS. 1A–1D, 2A–2D, and 3A–3D show cross-sections of a portion of a semiconductor device, illustrating several steps in the application of a first embodiment of the invention to a typical device.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 10 | | Semiconductor wafer | |
| 12 | Silicon oxide over single-crystal silicon | Substrate | May include other metal layers or other semiconductor elements, (e.g. transistors, diodes); Compound semiconductors (e.g. GaAs, InP, Si/Ge, SiC) may be used in place of Si. |
| 14 | Aluminum alloy | Metal layer | Trilayer of TiN/AlCu/TiN; Alloys of Al, Cu, Mo, W, Ti, Si; Polysilicon, silicides, nitrides, carbides; AlCu alloy with Ti or TiN underlayers; Metal layer. |
| 15 | | First portion of metal layer 14 | First portion of metal layer 14 where widely-spaced leads 16 will be formed |
| 16 | | Widely-spaced leads | |
| 17 | | Second portion of metal layer 14 | Second portion of metal layer 14 where closely-spaced leads 18 will be formed |
| 18 | | Closely-spaced leads | |
| 20 | IX725 | First resist layer | Electron resist; other resists or photoresists; light-sensitive polyimide. Portions may act as a first mask for second portion of metal layer 15 |
| 22 | | First reticle | Contains pattern for widely-spaced leads 16. |
| 24 | | Exposed portions of first resist layer 20 | |
| 26 | SiO$_2$ | First structural dielectric layer | Oxide, nitride, dense glass, solid inorganic, solid organic, other suitable rigid dielectric; oxide. |
| 28 | | Second resist layer | Electron resist; other resists or photoresists; light-sensitive polyimide. Portions may act as a second mask for first structural dielectric layer overlying first portion 15 of metal layer. |
| 30 | | Second reticle | Contains pattern for closely-spaced leads 18. |
| 32 | | Exposed portions of second resist layer 28 | |
| 34 | Parylene | Low-permittivity material | Other polymer dielectrics such as teflon, aerogel, airgap (inert gases or vacuum). |
| 36 | PETEOS (Plasma-enhanced tetra-ethoxysilane) | Second structural dielectric layer | Silsesquioxane; SOG (spin-on glass); other oxides. |
| 38 | | Passivating layer | Oxide or nitride layer |
| 39 | Silicon nitride/silicon dioxide | Etch-stopping dielectric layer | Silicon dioxide |
| 40 | | First metal pattern | Used to block closely-spaced leads area 17. |
| 42 | | Second metal pattern | Used to pattern closely-spaced leads 18. |
| 44 | | First reticle of third embodiment | Contains patterns for both widely- and closely-spaced leads. |
| 46 | | First resist layer of third embodiment | Photoresist |
| 48 | | Exposed portions of first resist layer of third embodiment | |
| 50 | Photoresist | Second resist layer of the third embodiment | Photo-sensitive polyimide |

FIGS. 1–3 show a first embodiment of the present invention. FIG. 1A shows a semiconductor wafer 10 that has a substrate 12 which may, for example, contain transistors, diodes, and other semiconductor elements (not shown) as are well known in the art. Semiconductor wafer 10 may also contain metal layers. Metal layer 14 has been deposited over the substrate 12. Metal layer 14 may comprise, for example, an aluminum alloy or a titanium-tungsten/aluminum ahoy bilayer and is typically from 0.5 to 2 µm thick. In this invention, metal layer 14 has been divided into two sections; a first portion 15 where widely-spaced leads will be formed, and a second portion 17 where closely-spaced leads will be formed.

Figure 1B:
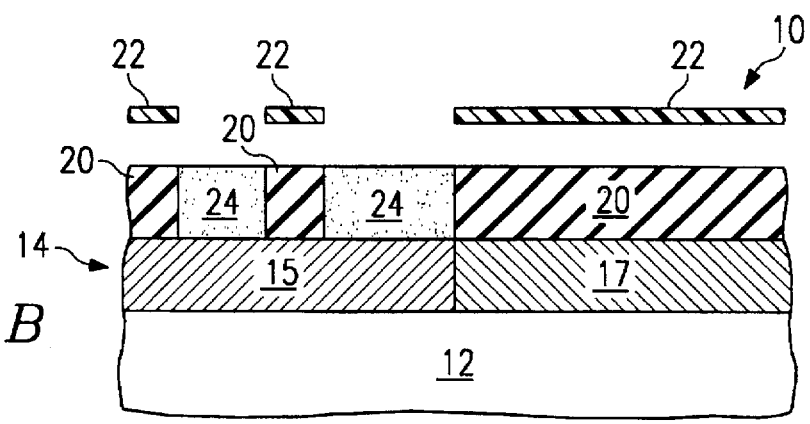
Figure 1C:
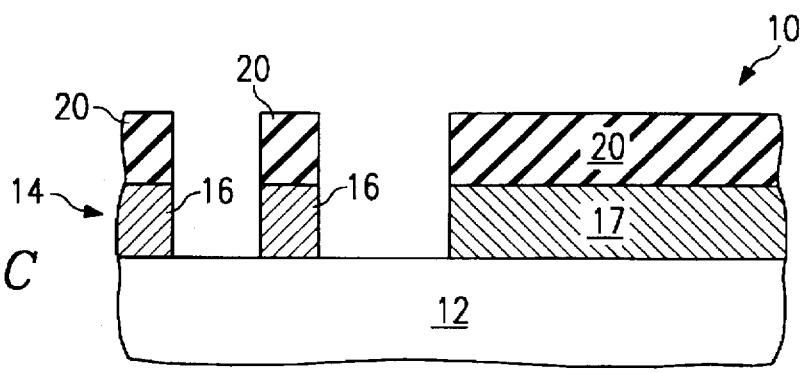
Figure 1D:
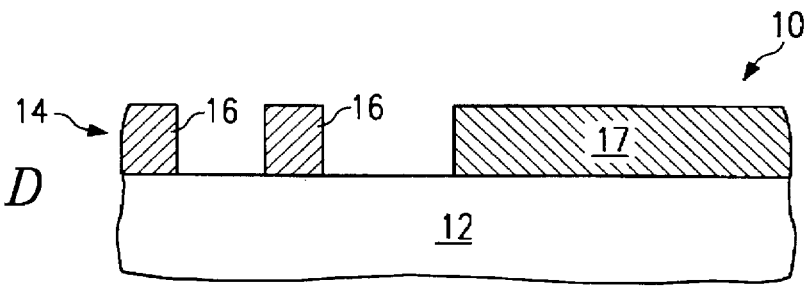

FIG. 1B shows a first resist layer 20 that has been deposited over metal layer 14. The wafer is then masked with a predetermined pattern, with first reticle 22. First reticle 22 is configured such that only the widely-spaced leads 16 will be patterned; the areas of metal layer 14 that will eventually be closely-spaced leads (second portion 17 of metal layer 14) are not patterned at this time. Uncovered portions of the first resist layer 20 are exposed as shown in FIG. 1B. Exposed portions 24 of the first resist layer 20 are developed and then removed. The metal layer 14 is then etched to form widely-spaced leads 16 as shown in FIG. 1C. Widely-spaced leads 16 may typically have a spacing aspect ratio of less than one. (The spacing aspect ratio is the height of the metal lead compared to [i.e. divided by] the space between leads.) Generally, the widely-spaced leads 16 are spaced apart at distances typically one and one-half the minimum lead-to-lead spacing or greater. The spaces between such widely-spaced leads 16 are sufficient to prevent excessive capacitive effects, and thus do not require low-permittivity materials for isolation. Then the first resist layer 20 is stripped, resulting in the structure shown in FIG. 1D. At this point, widely-spaced leads 16 have been formed, while the second portion 17 of metal layer 14 where closely-spaced leads will be formed remains unetched.

Figure 2A:
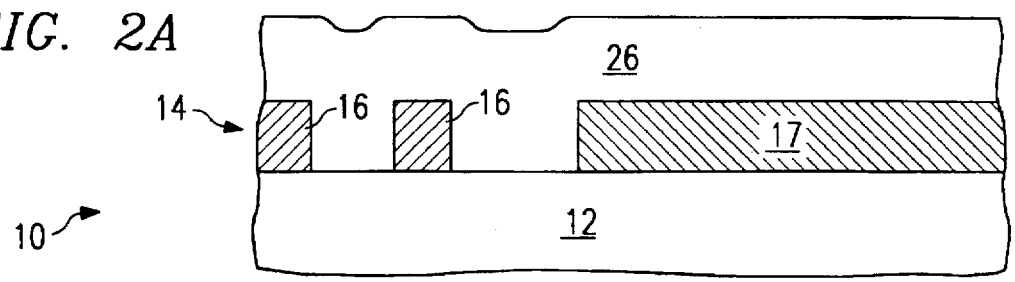
Figure 2B:
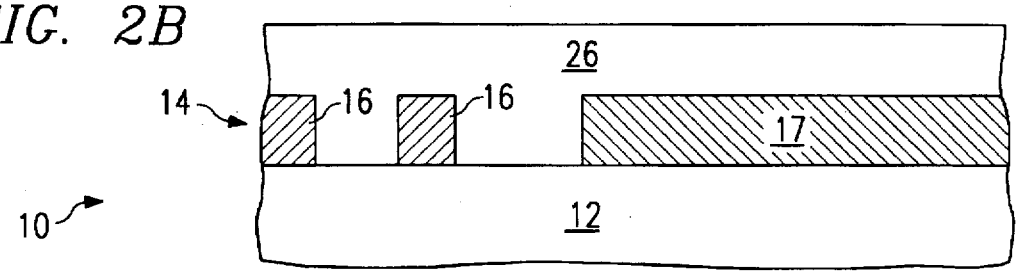
Figure 2C:
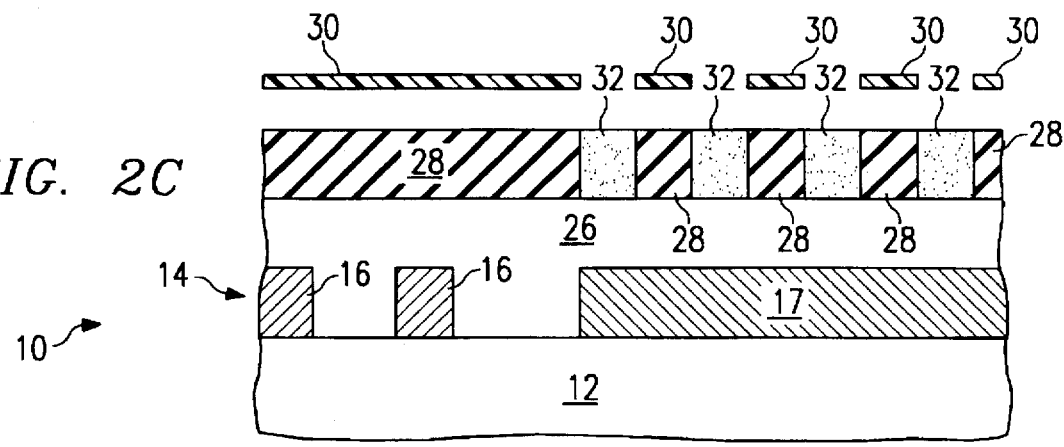
Figure 2D:
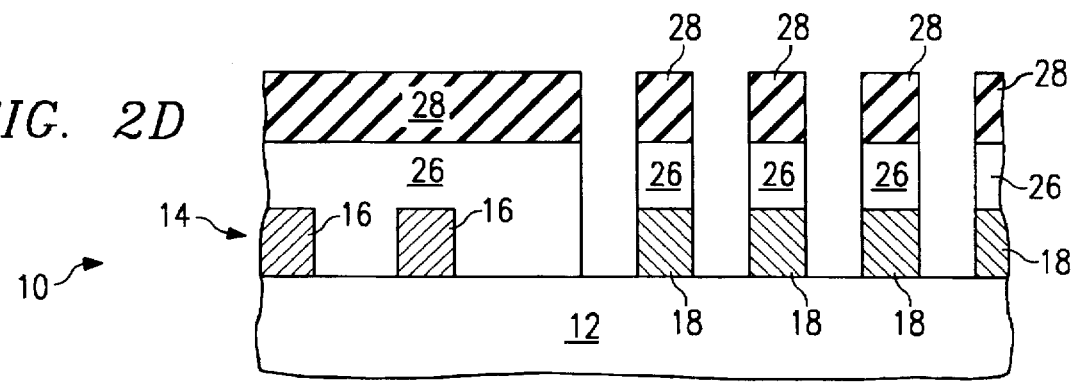

Next, first structural dielectric layer 26 is deposited on metal layer 14, as shown in FIG. 2A. This dielectric material may flow in a pattern similar to the topography of the metal beneath it, forming waves, or bumps, and is typically 0.25 to 2 µm thick on top of the metal layer 14 and widely-spaced metal leads 16. Then the first structural dielectric layer 26 may be planarized, preferably globally planarized by CMP (chemical-mechanical polishing) as shown in FIG. 2B. Second resist layer 28 is deposited over the first structural dielectric layer 26. Then a second reticle 30 containing the pattern for the closely-spaced leads 18 is placed over the wafer 10. The uncovered portions of the second resist layer 28 are exposed as shown in FIG. 2C. Exposed portions 32 of the second resist layer 28 are developed and then removed. The first structural dielectric layer 26 and metal layer 14 are then etched (generally in two separate etches) to form closely-spaced leads 18 as shown in FIG. 2D. For example, the $SiO_2$ may be etched using a $CHF_3$ RIE (reactive ion etch) and then the metal layer 14 may be etched with $BCl_3$ in a separate etch process. Closely-spaced leads 18 typically have a spacing aspect ratio in the range of greater than or equal to one. Generally, closely-spaced leads 18 are spaced apart at distances typically less than one µm, and the spacing can be the same as the minimum lead (conductor) width. The spaces between the leads are close enough together to possibly have significant parasitic capacitance, and thus the structure would benefit from a dielectric layer containing a low-permittivity material for a dielectric material.

Figure 3A:
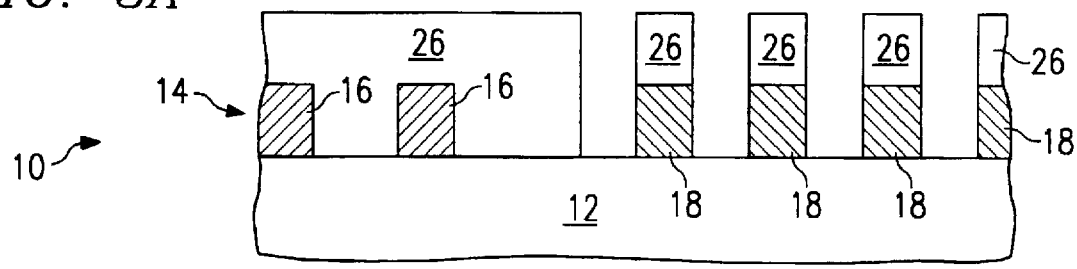
Figure 3B:
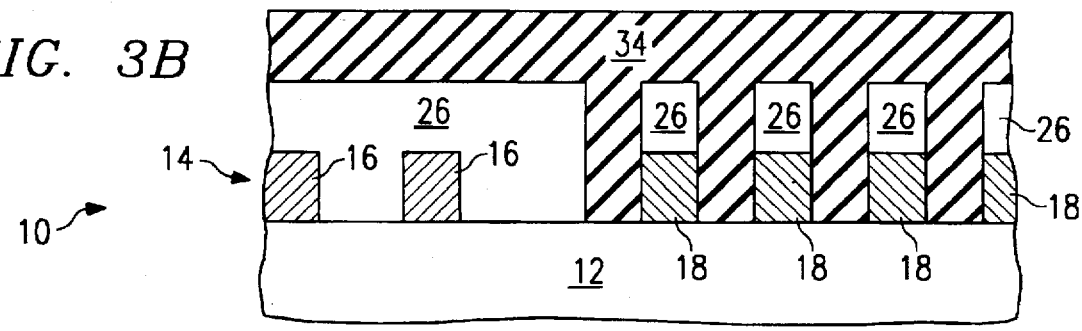

Then the second resist layer 28 is stripped, resulting in the structure shown in FIG. 3A. At this point, closely-spaced leads 18 have been formed. Next, low-permittivity material 34 is deposited on the wafer, either partially filling or completely filling the spaces between the closely-spaced leads 18 as shown in FIG. 3B. The low-permittivity material 34 is comprised of a material having a low-dielectric constant, preferably a polymer dielectric such as parylene or teflon with a dielectric constant of less than approximately 3. The low-permittivity material 34 is then removed, e.g. etched back (possibly with a timed etch), (FIG. 3C) to a level at or below the top of first dielectric layer 26. In this embodiment, the low-permittivity material 34 should preferably not be etched down past the top of the closely-spaced metal leads 18. Preferably, the low-permittivity material 34 lies a distance equal to 30–50% the thickness of the metal lead 18 above the top of the closely-spaced metal leads 18, to eliminate or reduce the fringing capacitance between metal leads 18 at the corners and tops of closely-spaced metal leads 18. The reduction of fringing capacitance is an advantage of this embodiment, which is a result of the increased height of the low dielectric layer 34, which may extend beyond the top of the closely-spaced metal leads 18.

Figure 3C:
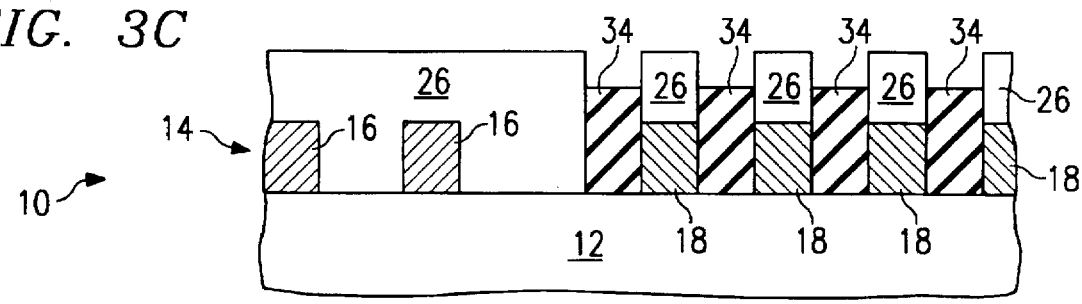
Figure 3D:
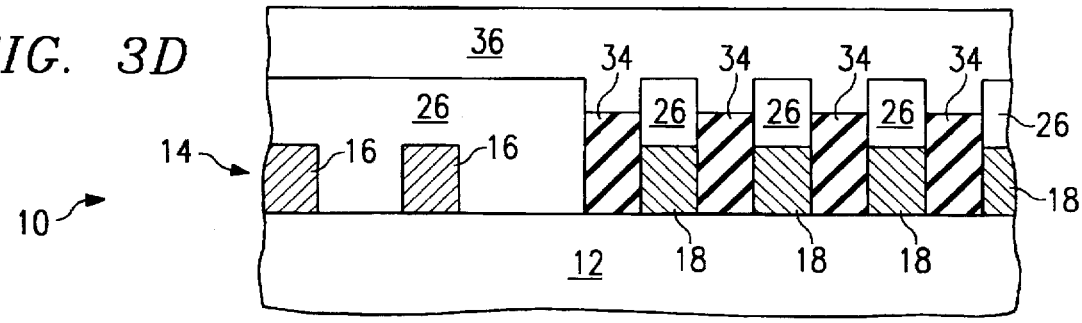

Finally, a second structural dielectric layer 36 is deposited over both the widely-spaced and closely-spaced leads (16, 18) as shown in FIG. 3D. Preferably, PETEOS (plasma-enhanced tetraethoxysilane) is used for the second structural dielectric layer 36.

Figure 4A:
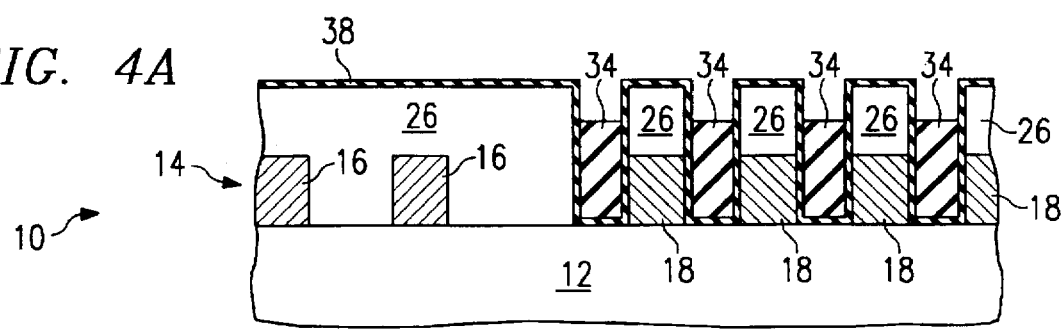
FIGS. 4A and 4B show cross-sections of a second embodiment, which is the first embodiment depicted in FIGS. 1–3 with the added feature of a passivating layer deposited over the closely-spaced metal leads.
Figure 4B:
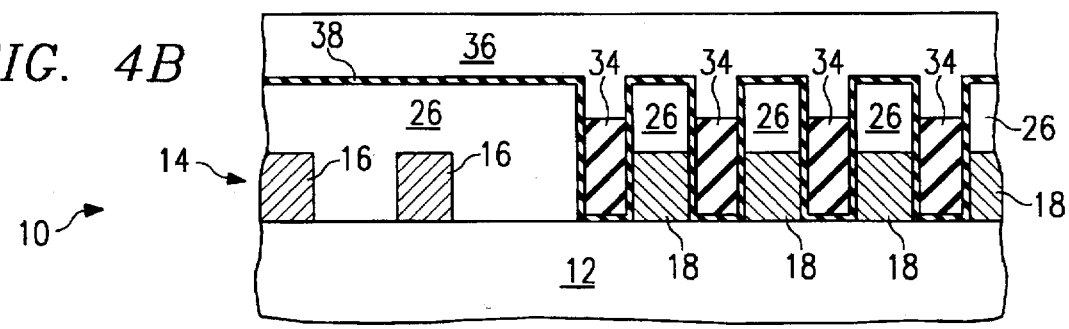

FIG. 4A shows a second (alternate) embodiment of the present invention in which, after the step shown in FIG. 3A, a passivating layer 38 is formed on exposed portions of first structural dielectric layer 26 and sidewalls of closely-spaced metal leads 18. This passivating layer 38 is beneficial because it prevents reaction between the metal leads 18 and the low-permittivity material 34. Subsequent steps shown in FIGS. 3B to 3D are performed to form the resulting structure shown in FIG. 4B.

Next, a third embodiment of the invention will be described, as depicted in FIGS. 5 to 6. FIG. 5A shows a semiconductor wafer 10 which includes a metal layer 14 deposited over a substrate 12. Again, metal layer 14 has been divided into two sections; a first portion 15 where widely-spaced leads will be formed, and a second portion 17 where closely-spaced leads will be formed. An etch-stopping dielectric layer 39, e.g. low-dielectric organic spin-on-glass (OSOG), is applied over the metal layer 14. A first resist layer 46 of the third embodiment is then deposited over metal layer 14. The first resist layer 46 is preferably comprised of photoresist, or other resists such as photosensitive polyimide may be used.

Figure 5A:
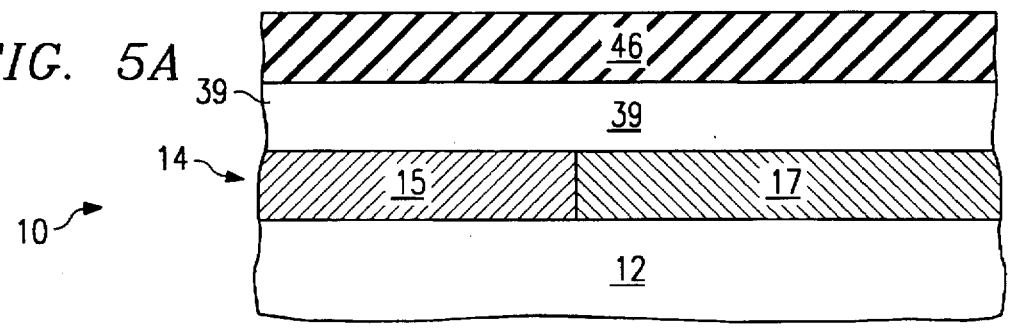
FIGS. 5A–5e, and 6A–6E show cross-sections of a portion of a semiconductor device, illustrating several steps in the application of a third embodiment of the invention to a typical device.
Figure 5B:
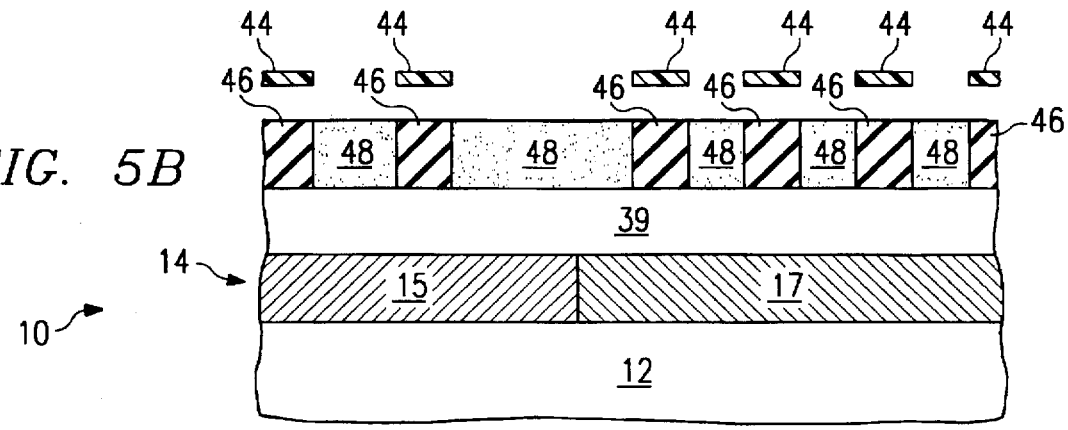
Figure 5C:
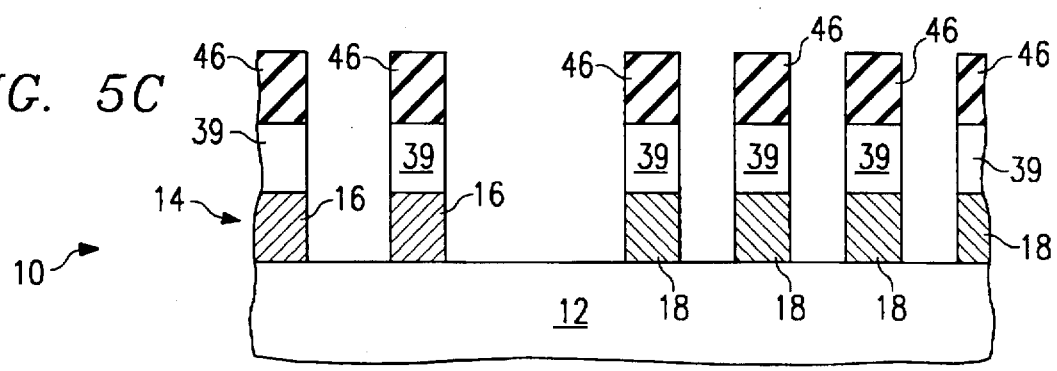
Figure 5D:
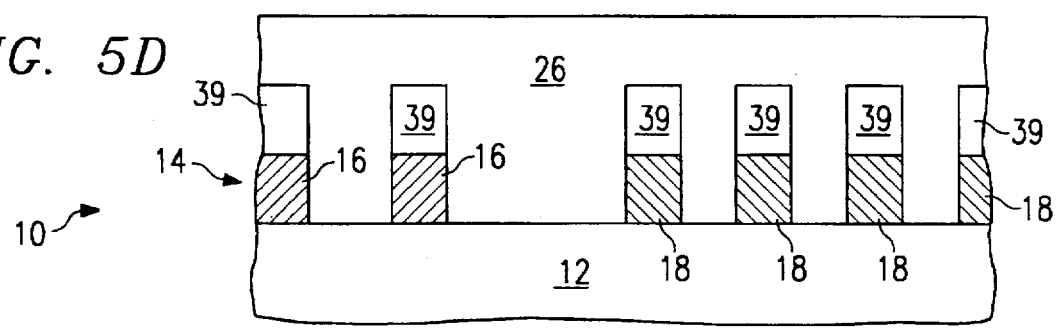
Figure 5E:
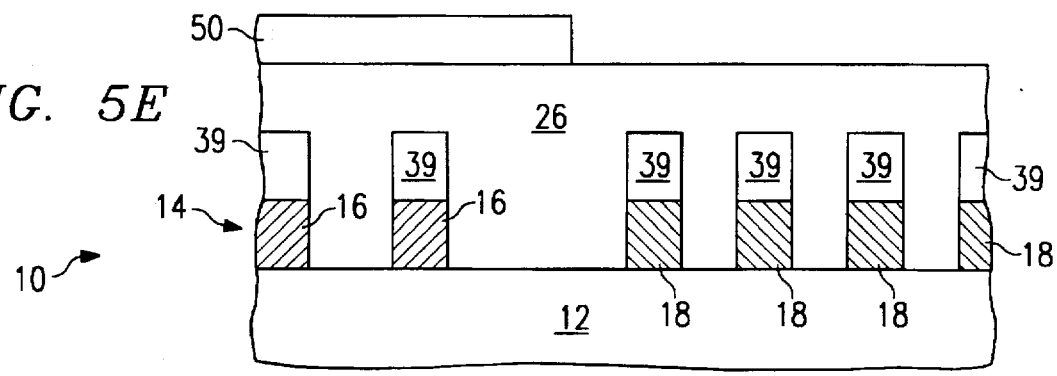

The wafer 10 is masked with the first reticle 44 of the third embodiment, which contains the conductor pattern. The first reticle 44 is configured such that both widely-spaced and closely-spaced leads will be patterned at the same time. Uncovered portions of the first resist layer 46 are exposed as shown in FIG. 5B. Exposed portions 48 of the first resist layer are developed and removed. Etch-stopping dielectric layer 39 and metal layer 14 are etched, typically in separate steps (FIG. 5C). The first resist layer 46 is stripped, and first structural dielectric layer 26 is deposited over the entire wafer 10 and may then be planarized (FIG. 5D). Second resist layer 50 of the third embodiment is applied and exposed in a pattern so that the widely-spaced leads 16 of metal layer 14 remain covered with second resist layer 50 (FIG. 5E). Second resist layer 50 of the third embodiment is preferably comprised of photoresist, but also could comprise a photosensitive polyimide.

Figure 6A:
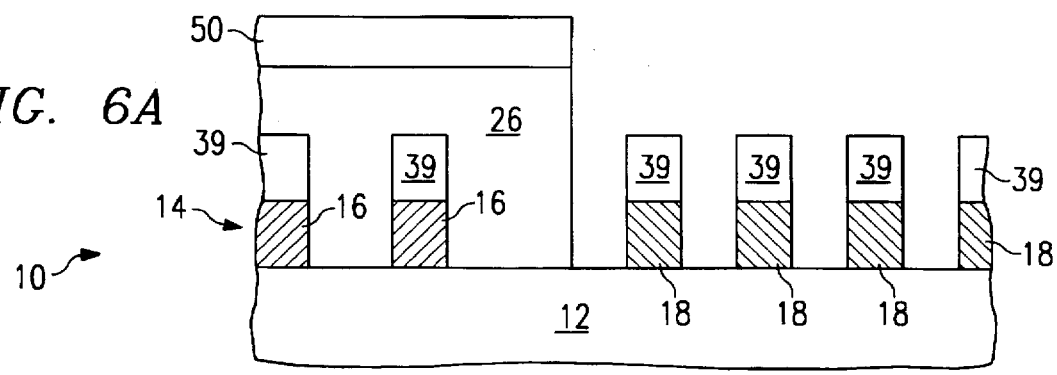
Figure 6B:
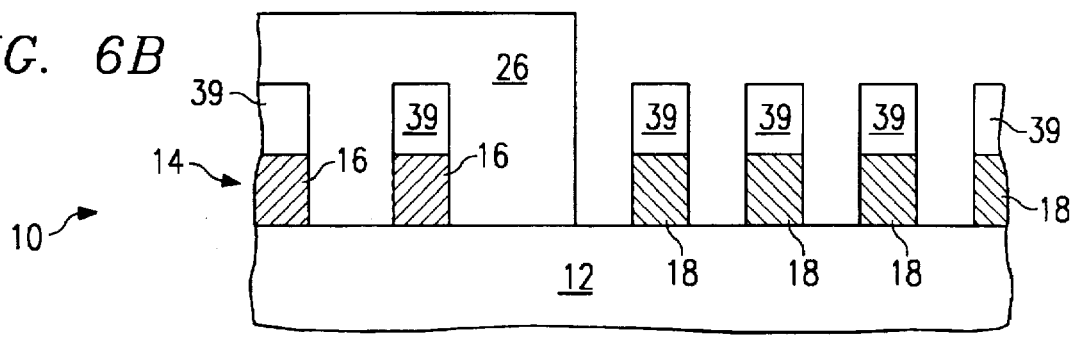
Figure 6C:
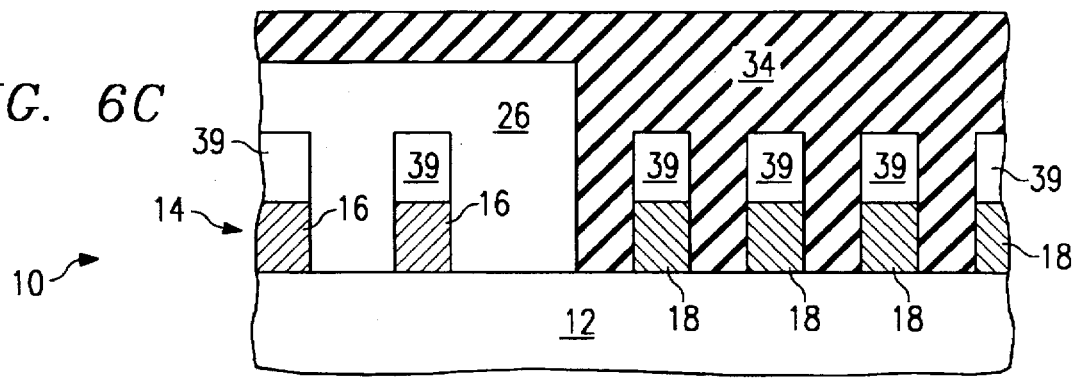
Figure 6D:
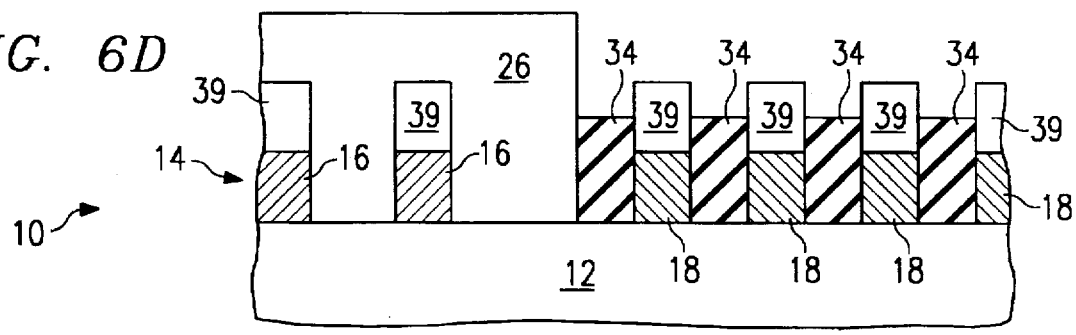
Figure 6E:
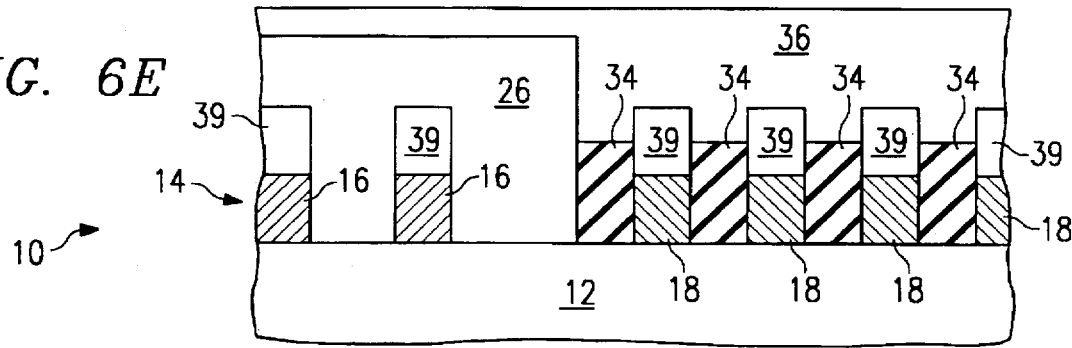

The first structural dielectric layer 26 is etched from the closely-spaced leads 18 of metal layer 14 (FIG. 6A). Second resist layer 50 of the third embodiment is then removed (FIG. 6B). Low-permittivity material 34 is applied over the entire wafer 10 (FIG. 6C) and etched back to a level at or below the top of etch-stopping dielectric layer 39 (FIG. 6D). Etch-stopping dielectric layer 39 serves as an etch stop for the low-permittivity dielectric layer 34 etchant. Finally, second structural dielectric layer 36 is deposited over the etch-stopping dielectric layer 39 above closely-spaced metal leads 18, low-permittivity material 34 and possibly over first structural dielectric layer 26 as shown in FIG. 6E.

Typically, for the third embodiment, first structural dielectric layer 26 and second structural dielectric layer 36 are comprised of an oxide and etch-stopping dielectric layer 39 is comprised of a low-dielectric constant OSOG having a dielectric constant of less than 3. However, other combinations of materials can be used. For example, etch-stopping dielectric layer 39 may be comprised of an oxide, while the first and second structural dielectric layers 26 and 36 can both be Teflon or parylene. The latter combination may be especially compatible with low-permittivity materials 34 comprising aerogel or xerogel.

The alternate embodiment shown in FIG. 4A could also be combined with the third embodiment. After the first photoresist 46 of the third embodiment is removed (from FIG. 5C), a passivating layer 38 may be formed on sidewalls of both widely-spaced 16 and closely-spaced metal leads 18 (not shown). This passivating layer 38 is particularly beneficial to closely-spaced metal leads 18 because it prevents reaction between the closely-spaced metal leads 18 and the low-permittivity material 34.

Figure 7A:
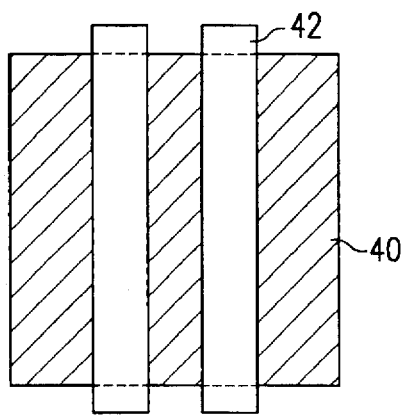
FIGS. 7A–7C show top views of a wafer and possible patterning configurations for the metal layer.

FIG. 7A shows a top level view of the pattern for the portion 17 of the metal layer 14 where the closely-spaced leads 18 will be formed, as described in the first embodiment and depicted in FIGS. 1–3. The first metal pattern 40 blocks the second portion 17 of the metal layer 14, to protect the area from the first patterning step. The second metal pattern 42 has etch lines that extend slightly beyond the edge of the first metal pattern 40, to allow for tolerancing mismatch between the first patterning step and the second patterning step. This will prevent shorts and undesired metal in the resulting metal layer formed. It is important to either form a full metal lead or none at all at the edges where the two metal patterns 40 and 42 meet.

Figure 7B:
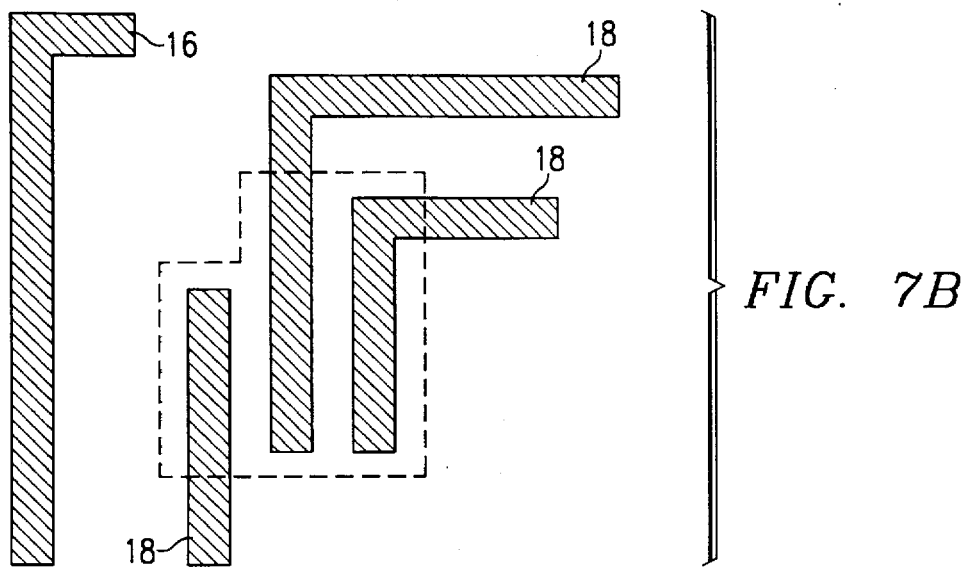
Figure 7C:
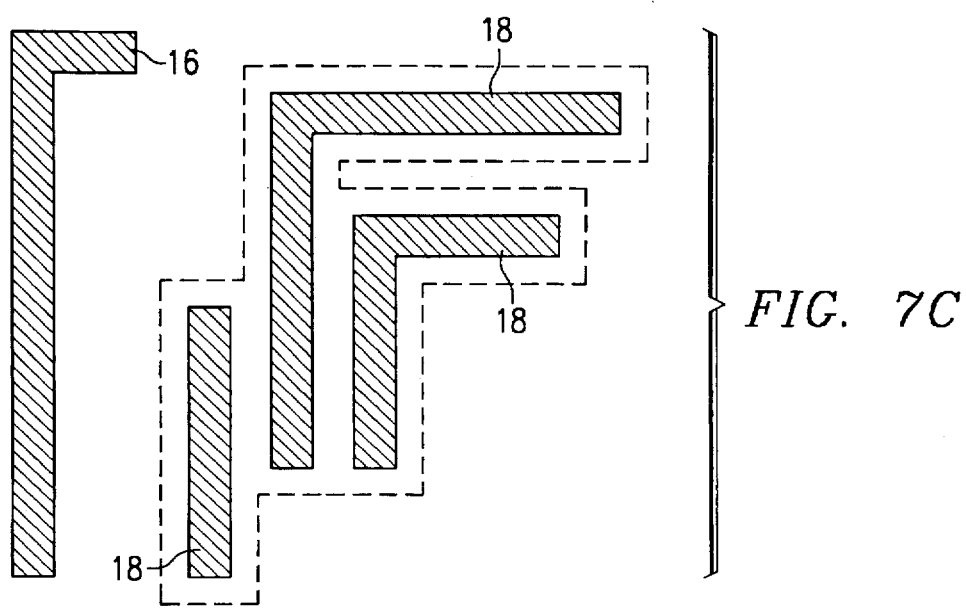

At least two alternative methods of blocking off the areas where closely-spaced leads will be formed are available. FIG. 7B shows a section of leads that contain both widely-spaced 16 and closely-spaced leads 18. One method would be to mask the adjacent portions only of the closely-spaced leads, as shown within the dotted line box in FIG. 7B. However, a misalignment problem could be introduced with this method (unless the method of FIGS. 5A–5E, and 6A–6E is used), since portions of a single metal lead will be formed in two different steps. Alternately, the entire lead could be blocked, for a lead having at least a portion that is closely-spaced, as shown in FIG. 7C. This may prevent possible alignment problems that could occur with the method of FIG. 7B.

The novel method of using a two-step metal etch process to form both widely-spaced and closely-spaced leads in a metal layer in order to selectively fill gaps between closely-spaced leads with low-permittivity material can offer definite advantages over the conventional processes. First, the structurally weak low-permittivity material is limited to areas that benefit from it. In the areas where low-permittivity material is not needed, the structural dielectric layer provides more structural support. The result is an overall stronger structure, with better heat transfer capability (since the heat transfer of low-permittivity materials is generally poor).

Second, although an extra masking step is required in the first embodiment, generally the alignment is not critical and it may, for example, be avoided by blocking the entire lead for closely-spaced leads.

Third, the third embodiment provides for patterning the entire metal layer at once, eliminating the possible alignment issues of the first embodiment. The reticle that patterns the resist to mask the widely-spaced leads can be relatively easily generated from the reticle in existence for the metal layer. Thus, the implementation of this embodiment may be easier into current process flows.

Fourth, the first structural dielectric layer 26 on top of closely-spaced leads 18 in the first and second embodiments, and the etch-stopping dielectric layer 39 on top of closely-spaced leads 18 in the third embodiment, have the additional advantage of reducing fringing capacitance between closely-spaced leads 18. These dielectric layers (26, 39) allow for increased height of the low-permittivity material 34 between closely-spaced leads 18, enabling the low-permittivity material to extend beyond the top of the metal leads. This provides for an increase in process margin.

A fifth advantage of the invention is that vias to underlying metal leads may be formed through a structurally sound and high quality dielectric (the first structural dielectric layer 26 on top of closely-spaced leads 18 in the first and second embodiments, and the etch-stopping dielectric layer 39 on top of closely-spaced leads 18 in the third embodiment), so that traditional via formation processes can be utilized.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for patterning a metal layer on a semiconductor wafer having a substrate, comprising the steps of:

depositing a metal layer on said substrate, said metal layer having a first portion and a second portion;

then forming widely-spaced leads in said first portion of said metal layer, said widely-spaced leads having leads spaced apart by more than the thickness of said metal layer;

then depositing a first structural dielectric layer on at least said widely-spaced leads and forming at least portions of closely-spaced leads in said second portion of said metal layer, said closely-spaced leads having leads spaced apart less than or equal to the thickness of said metal layer;

then depositing a low-permittivity material between at least said closely-spaced leads, said low-permittivity material providing a dielectric constant of less than 3 in a region between at least two of said closely-spaced metal leads; and then depositing a second structural dielectric layer over at least said low-permittivity material and said closely-spaced leads.

2. The method of claim 1 wherein said forming at least portions of closely-spaced leads in said second portion of said metal layer is performed before said depositing a first structural dielectric layer on at least said widely-spaced leads.

3. The method of claim 1 wherein the step of forming said closely-spaced leads precedes the step of depositing said first structural dielectric layer.

4. The method of claim 1 wherein all of said closely-spaced leads are formed during said forming closely-spaced leads step.

5. The method of claim 1 and further comprising the step of planarizing said first structural dielectric layer, after said depositing a first structural dielectric layer step.

6. The method of claim 1 and further comprising, after said step of depositing a metal layer, the sequential steps of:

depositing a etch-stopping dielectric layer on said metal layer;

patterning said etch-stopping dielectric layer; and covering said second portion of said metal layer;

and further comprising, before said step of forming closely-spaced leads, the step of:

uncovering said second portion of said metal layer.

7. The method of claim 1 further comprising, after said step of depositing a metal layer, the sequential steps of:

covering said second portion of said metal layer; and patterning said first portion of said metal layer;

further comprising, after said step of forming widely-spaced leads, the step of:

uncovering said second portion of said metal layer;

further comprising, after said step of depositing a first structural dielectric layer, the sequential steps of:

covering said first portion of said metal layer; and patterning said second portion of said metal layer;

and further comprising, after said step of forming portions of closely-spaced leads, the step of:

uncovering said first portion of said metal layer.

8. A method for patterning a metal layer on a semiconductor wafer having a substrate, comprising the steps of:

depositing a metal layer on a substrate, said metal layer having a first portion and a second portion;

depositing an etch-stopping dielectric layer on said metal layer;

depositing a resist layer on said etch-stopping dielectric layer;

patterning said resist layer to form a conductor pattern;

etching said etch-stopping dielectric layer and said metal to form metal leads, said metal leads having widely-spaced leads in said first portion of said metal layer wherein said widely-spaced leads have leads spaced apart by more than the thickness of said metal layer, said metal leads having closely-spaced leads in said second portion of said metal layer wherein said closely-spaced leads have leads spaced apart less than or equal to the thickness of said metal layer;

depositing a first structural dielectric layer on at least said widely-spaced leads;

depositing a low-permittivity material between at least said closely-spaced leads, said low-permittivity material providing a dielectric constant of less than 3 in a region between at least two of said metal leads; and depositing a second structural dielectric layer on at least said low-permittivity material and said closely-spaced leads.

9. The method of claim 8 wherein said low-permittivity material is also deposited between said etch-stopping dielectric layer in areas adjacent said closely-spaced leads.

10. The method of claim 8 and further comprising the step of planarizing said first structural dielectric layer, after said depositing a first structural dielectric layer step.

* * * * *